United States Patent [19]

Durand

[11] 4,435,224

[45] Mar. 6, 1984

[54] PROCESS FOR PREPARING HOMOGENEOUS LAYERS OF COMPOSITION $HG_{1-x}CD_xTE$

[75] Inventor: Alain Durand, Paris, France

[73] Assignee: Societe Anonyme de Telecommunications, Paris, France

[21] Appl. No.: 234,753

[22] Filed: Feb. 17, 1981

[30] Foreign Application Priority Data

Feb. 22, 1980 [FR] France .................................. 80 04015

[51] Int. Cl.³ .................. H01L 21/205; H01L 21/324
[52] U.S. Cl. ...................................... 148/1.5; 29/572; 148/174; 148/175; 156/609; 156/612; 156/DIG. 72; 156/DIG. 73; 252/62.32 T; 252/501.1; 357/11; 357/30; 357/61; 427/74; 427/76
[58] Field of Search ................... 29/572; 148/1.5, 174, 148/175; 156/609, 612, DIG. 72, DIG. 73; 427/74, 76; 136/260, 264; 252/62.32 T, 501.1; 313/386; 357/11, 30, 61

[56] References Cited

U.S. PATENT DOCUMENTS

| | | | |
|---|---|---|---|
| 3,403,133 | 9/1968 | Fredrick et al. | 252/62.32 T |
| 3,472,685 | 10/1969 | Marfaing | 156/612 |
| 3,496,024 | 2/1970 | Ruehrwein | 156/DIG. 72 |
| 3,622,405 | 11/1971 | Schmit | 156/DIG. 72 |
| 3,725,135 | 4/1973 | Hager et al. | 148/1.5 |
| 3,779,803 | 12/1973 | Lee et al. | 148/174 X |
| 4,105,477 | 8/1978 | Johnson et al. | 357/61 X |

OTHER PUBLICATIONS

Pawlikowski et al, "Some Properties of Photovoltaic CdHgTe . . . ", Infrared Physics, vol. 15, No. 4, Nov. 1975, pp. 331–337.

Primary Examiner—W. G. Saba
Attorney, Agent, or Firm—Holman & Stern

[57] ABSTRACT

Process for obtaining a homogeneous layer of composition $Hg_{1-x}Cd_xTe$, comprising the steps of:

subjecting a wafer formed by a layer of $Hg_{1-x_o}Cd_{x_o}Te$ deposited by epitaxial growth on a CdTe substrate, $x_o$ being less than the desired value x, to a melting treatment, then rapidly cooling the wafer.

4 Claims, 6 Drawing Figures

PROCESS FOR PREPARING HOMOGENEOUS LAYERS OF COMPOSITION $Hg_{1-x}Cd_xTe$

The present invention relates to a process for preparing layers of composition $Hg_{1-x}Cd_xTe$ made on a CdTe substrate, enabling a layer of $Hg_{1-x}Cd_xTe$ of very high internal homogeneity and an abrupt transition with the CdTe substrate, to be obtained.

The alloy $Hg_{1-x}Cd_xTe$ may be considered as a mixture, in proportions defined by the value of x, of HgTe and CdTe, and its forbidden band width varies as a function of x from a value $Eg=1.6$ eV for CdTe at 77° K. For $x=0.20$, the band width is about 0.1 eV at 77° K. and the corresponding domain of spectral sensitivity is between 8 and 14 $\mu$m.

It must be understood that the value of x of which it is question here defines the composition on the surface opposite the substrate, the proportion of cadmium increasing by x up to 1 on moving away from the outer surface.

The epitaxed layers of $Hg_{1-x}Cd_xTe$ are appropriately obtained by the EDRI technique (Isothermal Regime Evaporation-Diffusion) described in French Pat. No. 1,447,257. This process consists in placing a CdTe wafer and an HgTe wafer face to face inside a chamber in vacuo and in taking the temperature to a constant high value, generally between 500° and 600° C. In the case of thin layers, this process gives an insufficient superficial composition x for requirements, as it is at the most equal to 0.10-0.15.

To obtain the desired value of x, for example $x=0.20$, U.S. Pat. No. 3,725,135 proposes to establish in the treatment chamber an excess mercury vapour pressure by introducing a certain quantity of mercury in the chamber.

However, this process procures only a mediocre internal homogeneity. In other words, the gradient $\Delta x/\Delta e$ in the vicinity of the surface, e being the thickness of the layer, is too high. This prevents subsequent use of the techniques applicable to solid materials.

Moreover, the transition between the superficial zone of composition $Hg_{1-x}Cd_xTe$ and the substrate of CdTe is very progressive, hence the presence of an intermediate zone of considerable thickness in which the proportion x of cadmium increases progressively up to the value $x-1$.

This presents the drawback that it is not possible to use the face on the substrate side as face exposed to the radiation, as the part of the intermediate zone adjacent the superficial zone presents a composition and therefore a forbidden band width, close to those of the superficial zone.

In the case of illumination of the face on the substrate side, the photons of shich the wave length is in the spectral domain envisaged—for example 8-14 $\mu$m—would pass through the substrate, the latter having a large forbidden band width, but would be absorbed by the intermediate zone before reaching the superficial zone.

Now, it would be advantageous to illuminate the face on the substrate side, for several reasons. In particular, as the electrical connections necessary for collecting the current must be placed on the face opposite the substrate, near the pn junction, the face bearing the connections would not be exposed to the radiation. This would make it possible to reduce the surface of the junctions and therefore to increase the density of the active points. In addition, it would become possible to make the substrate in the form of a lens concentrating the radiation.

However, the illumination of the face on the substrate side can only be envisaged if the absorption of the photons by the intermediate zone therefore the thickness of said zone, is very substantially reduced.

It is consequently an object of the invention to produce thin epitaxed layers of $Hg_{1-x}Cd_xTe$ on a CdTe substrate having an excellent internal homogeneity of the superficial layer of $Hg_{1-x}Cd_xTe$ and an abrupt transition between the superficial layer and the substrate, therefore a very small thickness of the intermediate zone.

To attain these ends, the invention provides subjecting a wafer, formed by a layer of superficial composition $Hg_{1-x_o}Cd_{x_o}Te$ epitaxed on a substrate of CdTe, $x_o$ being less than the desired value x, to a melting treatment, then to cool the wafer rapidly.

The invention resides in that, at a given temperature T included in the range of melting, there is a compositional difference between the $Hg_{1-x}Cd_xTe$ in the liquid state and the $Hg_{1-x}Cd_xTe$ in the solid stae. As may be seen from the accompanying phase diagram (FIG. 1), a liquid phase of composition $x_L$ is found, in equilibrium, with a solid phase of composition $x_S$, no intermediate composition between $x_L$ and $x_S$ being able to exist.

If a wafer whose profile is such as shown in FIG. 2 and which comprises a superficial zone of composition less than $x_L$, an intermediate zone of composition between $x_L$ and $x_S$ and a zone of composition greater than $x_S$, is subjected to melting, the superficial zone $(x<x_L)$ passes to the liquid state, the zone on the substrate side $(x>x_S)$ remains in the solid state, and the intermediate zone $(x_L<x<x_S)$ is divided into a liquid part and a solid part. Cooling sets this situation and the liquid phase, once solidified, presents a homogeneous composition x which is the average of the starting compositions in the zones becoming liquid during melting. A virtually zero gradient $\Delta x/\Delta e$ is thus obtained from the surface in the whole superficial part resulting from the solidification of the liquid phase. Furthermore, the part resulting from the solid phase has a composition at least equal to $x_S$, which results in an extremely abrupt transition with the superficial part.

It is easy to determine the melting temperature T for a given initial compositional profile so as to obtain the desired value x, since values $x_L$ and $x_S$, which are well defined, correspond to a temperature T.

The invention will be more readily understood on reading the following description with reference to the accompanying drawings, in which.

Figure 4:
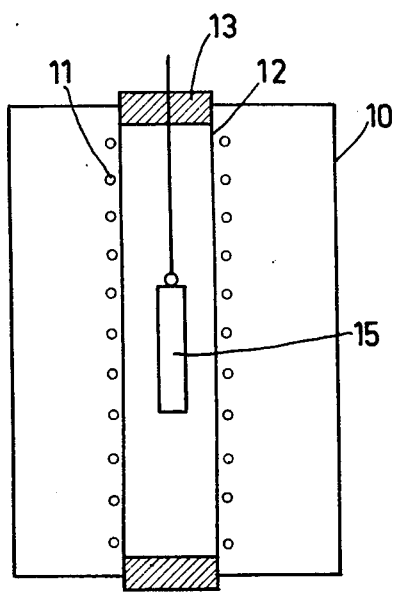

FIG. 4 schematically shows an arrangement for effecting heat treatment.

Figure 5:
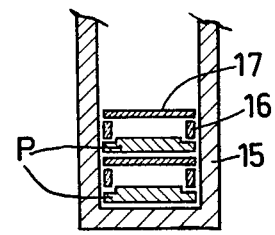

FIG. 5 shows, to a larger scale, the device supporting the wafers, and

Figure 6:
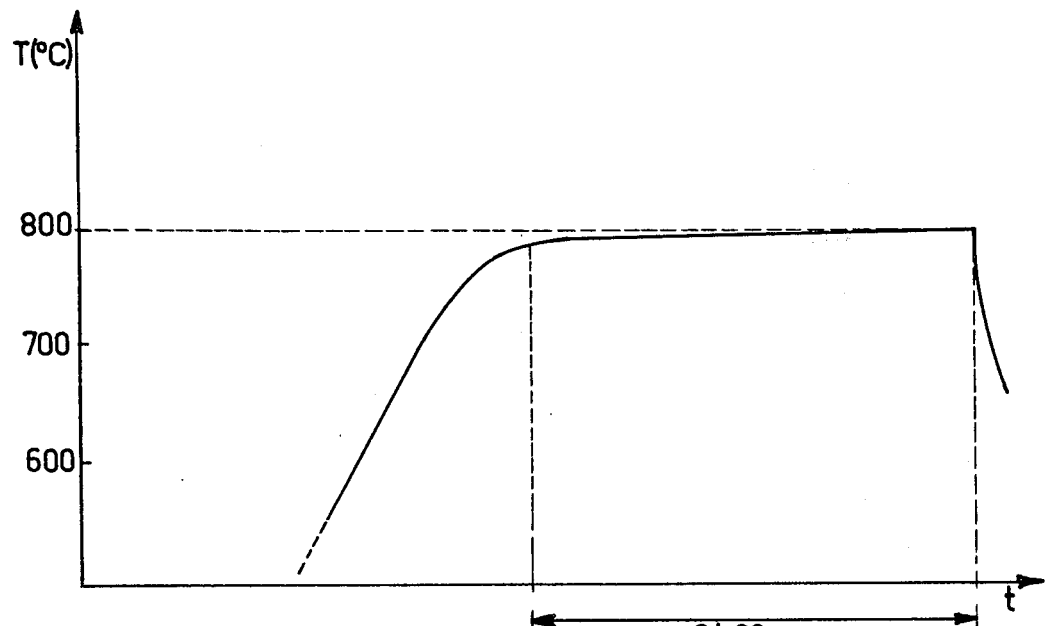

FIG. 6 shows the evolution of the temperature during the heat treatment according to the invention.

Figure 1:
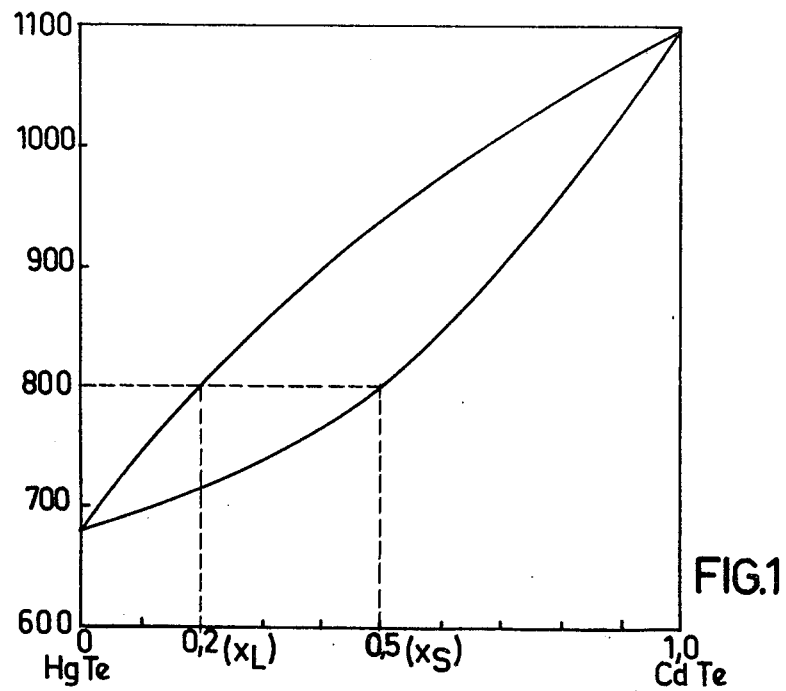
FIG. 1 shows the phase diagram of $Hg_{1-x}Cd_xTe$, as has been mentioned.

Referring now to the drawings, FIG. 1 is the phase diagram of $Hg_{1-x}Cd_xTe$ which is composed of the solidus curve S and the liquidus curve L. It will be noted that, at a given temperature, for example at 800°

C., the liquid phase has a composition $x_L = 0.2$, whilst the solid pahse has a composition $x_S = 0.5$ and that there is no intermediate composition at equilibrium between $x_L$ and $x_S$.

This property is used, as will be seen hereinafter, to obtain layers of $Hg_{1-x}Cd_xTe$ epitaxed on a substrate of CdTe presenting considerable internal homogeneity and a very abrupt transition with the substrate.

Figure 2:
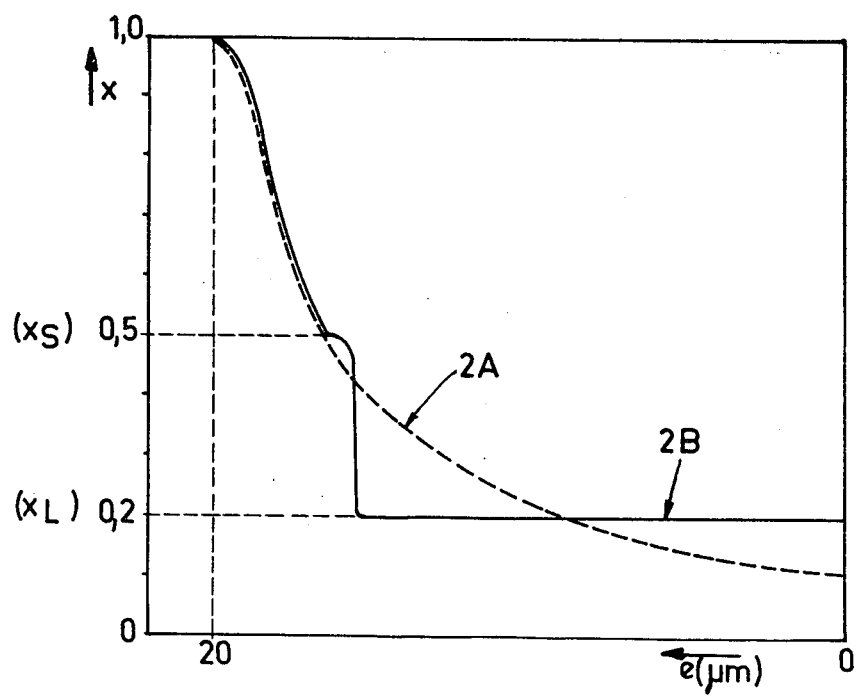
FIG. 2 illustrates by way of example the compositional profile obtained by the process of the invention, in the case of a thin layer.

In FIG. 2, the broken-line curve 2A shows the compositional profile of a thin layer of $Hg_{1-x}Cd_xTe$ deposited by epitaxial growth on a substrate of CdTe according to the above-mentioned EDRI technique. The thickness of the layer is 20 μm, and the superficial composition x is about 0.13. The EDRI process has been described in numerous publications and it is unnecessary to describe in detail the mode of preparing the starting thin layer.

It is known that the EDRI technique gives a good radial homogeneity but that the internal homogeneity is not good, particularly in the case of a thin layer, and curve 2A shows that the internal gradient $\Delta x/\Delta e$, e being the thickness, is very high.

The process according to the invention consists in taking the layer of $Hg_{1-x}Cd_xTe$ to a temperature T included in the range of melting, and in cooling it rapidly thereafter.

Let us assume that the melting point T is 800° C. The compositions $x_L$ and $x_S$ are defined by the phase diagram of FIG. 1 and are equal respectively to 0.2 and 0.5. By plotting these values on the profile of FIG. 2, it is observed that the starting layer is divided into three zones: a superficial zone where the composition is less than 0.2; an inner zone, adjacent the substrate, where the composition is greater than 0.5; and an intermediate zone where the composition is between 0.2 and 0.5.

When the layer is taken to temperature 800° C., it results from the phase diagram that the superficial zone becomes liquid, the inner zone remains solid and the intermediate zone divides into a part which remains solid and a part which becomes liquid. The liquid phase is obviously homogeneous and its proportion of cadmium x is the average value of this proportion on the part of the layer which has past to the liquid state. Sudden cooling provokes solidification of the liquid phase, but does not modify the compositions.

The final profile obtained is illustrated by the curve 2B in solid lines. The superficial zone of composition $x = 0.20$ presents a zero inner gradient. Its thickness is about 12 μm. The superficial zone is followed by a very abrupt transition zone, in which the composition passes from value $x = 0.20$ to value $x = 0.50$ over a thickness of the order of 1 to 2 μm. As to the inner zone, it is not modified with respect to the initial profile.

Such a profile enables the wafer thus obtained to be used to manufacture an infrared detector with illumination through the face on the substrate side or rear face. The CdTe substrate, of which the forbidden band width is important, is transparent to the photons having the wavelength in question, namely in the range 8–14 μm, and the transition zone, being given its very small thickness, virtually does not absorb the photons. The latter are absorbed only in the superficial zone, at the level of the pn junction which has been placed in the vicinity of the transition zone. As the superficial zone has only a small thickness of about 10 μm, this does not raise any problems.

In the example described, the value x obtained in the superficial zone and equal to 0.20 corresponds to the composition $x_L$ which results from the phase diagram. However, this coincidence is in no wise a necessity and it follows, on the contrary, from the foregoing that the value x obtained may be different from $x_L$.

The value x depends in fact on the initial profile of the composition $x_0 = f(e)$ and on the temperature T at which melting is effected. The temperature T determines the thickness $e_L$ of the part of the layer which becomes liquid during melting, and the value x is the mean of f(e) on thickness $e_L$, i.e. corresponds to integral $$\frac{1}{e_L} \int_0^{e_L} f(e)de$$

Figure 3:
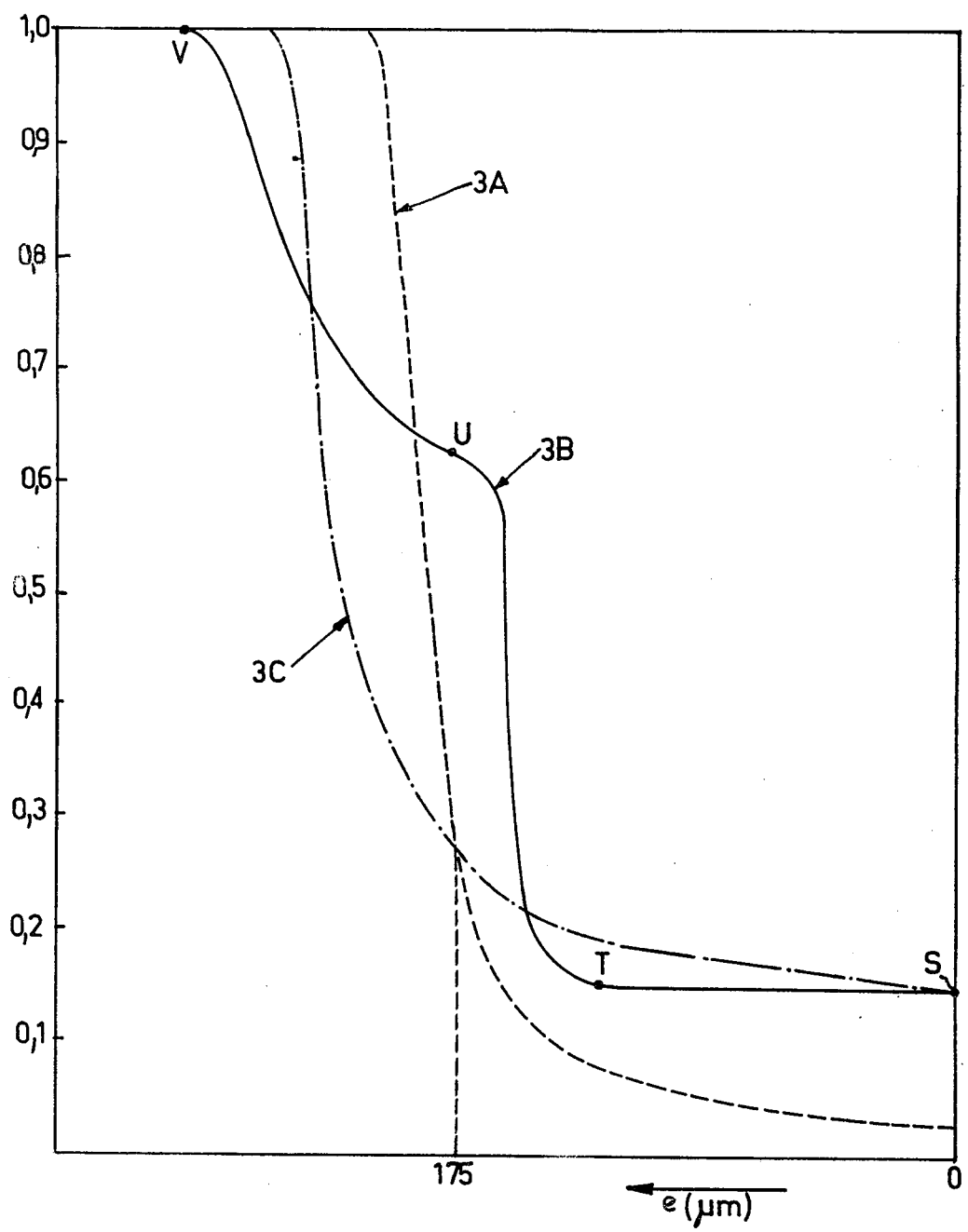
FIG. 3 illustrates another example of application of the invention in the case of a thicker layer.

The example illustrated in FIG. 3 concerns a thicker layer. Dashed curve 3A gives the inital profile of a layer obtained by the EDRI technique and 175 μm thick. The superficial composition $x_0$ of this layer is bout 0.03.

The solid-line curve 3B gives the profile obtained with the treatment according to the invention at 800° C. The homogeneous superfical zone ST has a composition $x = 0.14$–$0.15$ and extends over about 120 μm. This superficial zone is followed by a first, very abrupt transition zone TU, of about 55 μm thickness, in which the composition passes from 0.15 to about 0.60. A second, less abrupt, transition zone UV connects the first transition zone to the substrate.

FIG. 3 also shows a curve 3C in dashed and dotted lines which illustrates the profile obtained by subjecting the starting layer to an annealing treatment as described in French Patent App. No. 79 17014. In this case, a low, but appreciable inner gradient is observed in the superficial zone since the composition varies by 0.05 over about 140 μm thickness from the surface. In addition, in the intermediate zone between the superficial zone and the substrate, the composition increases much more progressively than in the layer obtained according to the invention. An infrared detector manufactured from this wafer could therefore not function by being illuminated on the substrate side.

FIGS. 4, 5 and 6 illustrate the practical embodiment of the thermal threatment according to the invention. Treatment is carried out in an electric oven 10 (cf. FIG. 4). A heating element 11 surrounds a chamber 12 inside which a quartz tube 15 containing the wafers to be treated, is suspended. The chamber 12 is tubular and closed at its two ends by stoppers 13 made of refractory material such as quartz wool. The tube 15 is placed at the centre of the tube 12, therefore in a zone where the temperature is constant.

FIG. 5 shows in section, and to a larger scale, the bottom of the tube 15. The wafers P to be treated are stacked inside the tube, separated by annular shims 16 and discs 17, all these elements also being made of quartz.

FIG. 6 shows the evolution of the temperature T as a function of time t in the course of the treatment, the temperature of treatment being chosen to be equal to 800° C.

The phase of temperature rise lasts about 2 hrs. 30 mins, this duration only being related to the functioning of the oven. The actual treatment consists in maintaining the temperature at 800° C. for a duration of about 2 hrs. 30 mins. At the beginning of this phase, the temperature is in fact very slightly lower than 800° C. and the value of 800° C. is attained only towards the end of the treatment. The oven is then stopped and the temperature drops very rapidly. The compositional profile is thus set in its state as at the end of the melting phase.

The treatment according to the invention is therefore very rapid since ts overall duration is a little greater than 5 hours.

What is claimed is:

1. In a process for preparing a wafer comprising an epitaxial layer of $Hg_{1-x}Cd_xTe$ on a substrate of CdTe by isothermal evaporation-diffusion in vacuo characterized by said epitaxial layer having mediocre internal homogeneity and a gradual compositional transition with the CdTe substrate, the improvement comprising:

depositing a layer of an intermediate composition $Hg_{1-x_o}Cd_{x_o}Te$, wherein $X_o < X$, by epitaxial growth on the CdTe substrate;

melting said layer by subjecting it to heating to a temperature above the liquids point of the layer; and cooling said melted layer rapidly.

2. The improved proces of claim 1 wherein said layer is melted at a temperature of about 800° C.

3. The improved process of claim 2 wherein the heating is maintained for about 2.5 hours.

4. The improved process of claim 1 wherein the heating is maintained for about 2.5 hours.

* * * * *